United States Patent
Kosaka et al.

(10) Patent No.: US 6,214,527 B1
(45) Date of Patent: Apr. 10, 2001

(54) PHOTOSENSITIVE CONDUCTOR PASTE

(75) Inventors: Yozo Kosaka; Katsuhiko Mizuno; Nobuaki Kimura; Toshihiko Takeda; Toshikazu Kakumu, all of Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/220,795

(22) Filed: Dec. 28, 1998

(30) Foreign Application Priority Data

Dec. 27, 1997 (JP) .................................................. 9-368722

(51) Int. Cl.$^7$ ................................ G03C 1/73; G03F 7/16
(52) U.S. Cl. ............................ 430/319; 430/281.1; 430/9; 430/17; 430/18
(58) Field of Search .................................. 430/9, 17, 18, 430/319, 270.1, 281.1; 313/491

(56) References Cited

U.S. PATENT DOCUMENTS

| 3,804,640 | * | 4/1974 | Buckwalter | 106/27 |
| 5,047,313 | * | 9/1991 | Nebe et al. | 430/281 |
| 5,049,480 | * | 9/1991 | Nebe et al. | 430/281 |
| 5,756,221 | * | 5/1998 | Horibe | 428/626 |
| 5,909,083 | * | 6/1999 | Asano et al. | 313/584 |

\* cited by examiner

Primary Examiner—Hoa Van Le
Assistant Examiner—Yvette M. Clarke
(74) Attorney, Agent, or Firm—Parkhurst & Wendel, L.L.P.

(57) ABSTRACT

There is provided a photosensitive conductor paste comprising at least a polymer, a monomer, a photopolymerization initiator, a conductive powder, a glass frit, and a solvent, the total content of the polymer, the monomer, and the photopolymerization initiator occupying 9 to 30% by weight on a solid basis of the photosensitive conductor paste, the conductive powder occupying 60 to 90% by weight on a solid basis of the photosensitive conductor paste, the glass frit occupying 1 to 10% by weight on a solid basis of the photosensitive conductor paste, the polymer having an alcoholic hydroxyl group and a carboxyl group.

5 Claims, 1 Drawing Sheet

PHOTOSENSITIVE CONDUCTOR PASTE

BACKGROUND OF THE INVENTION

1. Field of the Invention

The present invention relates to a photosensitive conductor paste that can form electrode patterns with high accuracy.

2. Background Art

In recent years, formation of fine patterns with higher accuracy at lower production cost has become required of the production of electrodes and the like in plasma display panels (PDP).

Electrode patterns in PDP have hitherto been formed, for example, by a printing method wherein a paste containing a conductive powder for patterns is printed by screen printing, offset printing or the like to form a predetermined pattern which is then dried and fired to form an electrode pattern.

The printing method is simple and can be expected to reduce the production cost. The printing method, however, suffers from the following drawbacks. Specifically, screen printing is disadvantageous in that there is a limitation in the accuracy of printing due to elongation of a mesh material constituting a screen printing plate. In addition, traces of the mesh are created in the pattern, or blurring of the pattern is created. This poses a problem of the accuracy in the edge shape of the electrode pattern. On the other hand, for the offset printing, with increasing the number of times of printing, the paste for the pattern is left on a blanket without being fully transferred onto a substrate. This lowers the accuracy of the pattern. For this reason, in order to maintain the accuracy of the pattern, the blanket should be replaced as the occasion demands to prevent leaving of the paste on the blanket. This procedure is very troublesome.

For the solution to the above problems, a method is considered effective which comprises the steps of: providing a photosensitive paste containing a conductive powder; forming a photosensitive conductor layer on a substrate by coating or transfer; subjecting the photosensitive conductor layer to exposure and development through a predetermined photomask; and firing the developed conductor layer to remove organic components, thereby forming an electrode pattern.

The conventional photosensitive conductor paste suffers from poor dispersibility of solid matter such as a conductive powder, poor developability, unsatisfactory photosensitivity, and poor edge shape of the electrode pattern. Therefore, it is difficult to form electrode patterns with high accuracy from the conventional photosensitive conductor paste.

The present invention has been made under the above circumstances, and it is an object of the present invention to provide a photosensitive conductor paste that can form high-definition electrode patterns.

SUMMARY OF THE INVENTION

According to the present invention, the above object can be attained by a photosensitive conductor paste comprising at least a polymer, a monomer, a photopolymerization initiator, a conductive powder, a glass frit, and a solvent, the total content of the polymer, the monomer, and the photopolymerization initiator occupying 9 to 30% by weight on a solid basis of the photosensitive conductor paste, the conductive powder occupying 60 to 90% by weight on a solid basis of the photosensitive conductor paste, the glass frit occupying 1 to 10% by weight on a solid basis of the photosensitive conductor paste, the polymer having an alcoholic hydroxyl group and a carboxyl group.

According to a preferred embodiment of the present invention, the polymer has a molecular weight of 10,000 to 150,000.

Further, according to a preferred embodiment of the present invention, the photopolymerization initiator is a morpholine photopolymerization initiator.

DETAILED DESCRIPTION OF THE INVENTION

Figure 1:
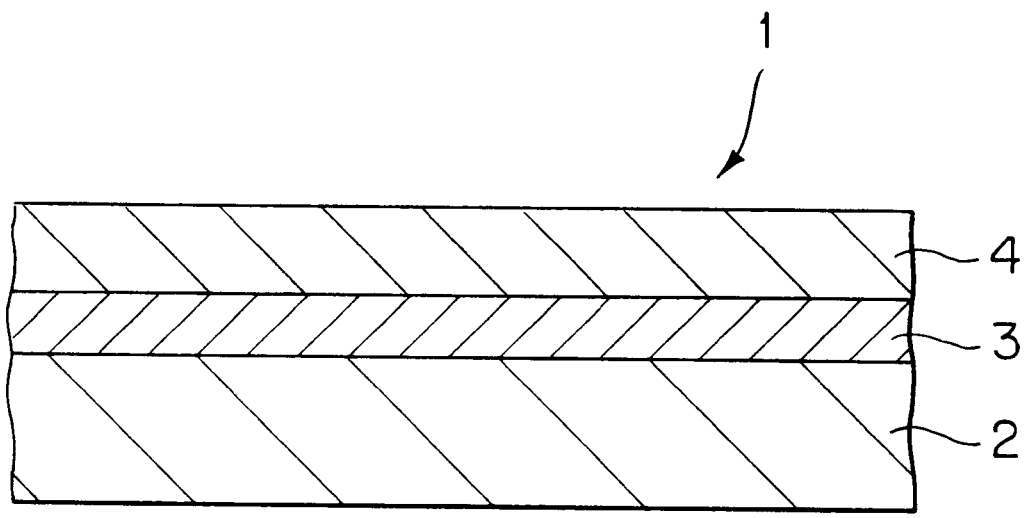
FIG. 1 is a schematic cross-sectional view showing one embodiment of a transfer sheet formed using the photosensitive conductor paste of the present invention.

Embodiments of the present invention will be described in more detail with reference to the accompanying drawings.

The photosensitive conductor paste of the present invention comprises at least a polymer, a monomer, a photopolymerization initiator, a conductive powder, a glass frit, and a solvent, the total content of the polymer, the monomer, and the photopolymerization initiator occupying 9 to 30% by weight on a solid basis of the photosensitive conductor paste, the conductive powder occupying 60 to 90% by weight on a solid basis of the photosensitive conductor paste, the glass frit occupying 1 to 10% by weight on a solid basis of the photosensitive conductor paste, the polymer having an alcoholic hydroxyl group and a carboxyl group.

When the total content of the polymer, the monomer, and the photopolymerization initiator is less than 9% by weight on a solid basis of the photosensitive conductor paste, the photosensitivity is unsatisfactory. This makes it difficult to form a desired pattern or results in lowered shape retention of the conductor paste layer. In particular, when the conductor paste is used as a rolled transfer sheet, problems occur associated with the storage stability and handleability of the roll. Further, when the transfer sheet is cut (slit) into a desired shape, waste derived from the inorganic components is likely to be produced and adversely affects the electrode pattern. On the other hand, when the total content of the polymer, the monomer, and the photopolymerization initiator exceeds 30% by weight, the amount of the organic components to be removed by firing is increased. This disadvantageously lowers the denseness of the electrode, leading to increased electrical resistance and often breaking of the pattern. When the content of the conductive powder is less than 60% by weight on a solid basis of the conductor paste, the amount of the organic components to be removed by firing is increased. This disadvantageously lowers the denseness of the electrode, leading to increased electrical resistance and often breaking of the pattern. On the other hand, when the content of the conductive powder exceeds 90% by weight, the photosensitivity is unsatisfactory. This makes it difficult to form a desired pattern or results in lowered shape retention of the conductor paste layer. In particular, when the conductor paste is used as a rolled transfer sheet, problems occur associated with the storage stability and handleability of the roll. Further, when the transfer sheet is cut (slit) into a desired shape, waste derived from the inorganic components is likely to be produced and adversely affects the electrode pattern. When the content of the glass frit is less than 1% by weight on a solid basis of the conductor paste, the adhesion of the electrode, after firing, to the substrate and the strength of the electrode after firing are lowered. On the other hand, a glass frit exceeding 10% by weight unfavorably results in deteriorated storage stability of the conductor paste, increased electrical resistance of the electrode, and deteriorated edge shape.

The components constituting the photosensitive conductor paste according to the present invention will be described.

Polymer

The polymer should be volatilized and decomposed upon firing and, after the firing, does not leave any carbides as a residue in the formed layer. Further, as described above, it should have an alcoholic hydroxyl group and a carboxyl group. The presence of an alcoholic hydroxyl group and a carboxyl group in the polymer provides good dispersibility of solid matter in the photosensitive conductor paste and the developability of the photosensitive conductor paste. The content of the alcoholic hydroxyl group in the polymer is generally 1 to 40% by mole, preferably 5 to 30% by mole.

The polymer has a glass transition temperature in the range generally of 20 to 90° C., and preferably in the range of 30 to 70° C., a molecular weight in the range generally of 10,000 to 150,000, and preferably in the range of 30,000 to 150,000, and an acid value in the range generally of 60 to 200, and preferably in the range of 70 to 120. When the glass transition temperature of the polymer is below 20° C., the adhesion to the substrate is deteriorated. On the other hand, when the glass transition temperature exceeds 90° C., no good coating surface cannot be formed by the photosensitive conductor paste. In this case, when the photosensitive conductor paste is used as a transfer sheet, the transferability of the photosensitive conductor paste is lowered. When the molecular weight of the polymer is less than 10,000, the shape retention of the photosensitive conductor paste layer is deteriorated. On the other hand, when the molecular weight exceeds 150,000, the developability of the photosensitive conductor paste is unfavorably deteriorated making it difficult to form a desired pattern. When the acid value of the polymer is less than 60, the developability of the photosensitive conductor paste is deteriorated. This makes it difficult to form a desired pattern. On the other hand, an acid value exceeding 200 provides no good coating surface. In this case, when the photosensitive conductor paste is used as a transfer sheet, the transferability of the photosensitive conductor paste is lowered. Further, the photosensitive conductor paste is likely to be dissolved in a developing solution, here again making it difficult to form a desired pattern.

Polymers having an alcoholic hydroxyl group and a carboxyl group usable in the photosensitive conductor paste according to the present invention include copolymers comprising: at least one member selected from methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, styrene, α-methylstyrene, and N-vinyl-2-pyrrolidone; at least one member selected from acrylic acid, methacrylic acid, a dimer of acrylic acid (for example, M-5600, manufactured by Toa Gosei Chemical Industry Co., Ltd.), 2-methacryloyloxyethyl succinate, 2-acryloyloxyethyl succinate, 2-methacryloyloxyethyl phthalate, 2-acryloyloxyethyl phthalate, 2-methacryloyloxyethyl hexahydrophthalate, 2-acryloyloxyethyl hexahydrophthalate, itaconic acid, crotonic acid, maleic acid, fumaric acid, vinylacetic acid, and anhydrides of these acids; and at least one monomer containing an alcoholic hydroxyl group selected from 2-hydroxyethyl acrylate, 2-hydroxyethyl methacrylate, 2-hydroxypropyl acrylate, 2-hydroxypropyl methacrylate, adducts of acrylic acid or methacrylic acid with ethylene glycol or propylene glycol compounds and the like.

Other polymers usable herein include adducts of the above copolymers with ethylenically unsaturated compounds having a glycidyl group or a hydroxyl group. Adducts of the above copolymers with ethylenically unsaturated compounds having a glycidyl group (amount added: 3 to 20% by mole) are particularly preferred. When the polymer is an adduct of the copolymer with an ethylenically unsaturated compound having a glycidyl group, an alcoholic hydroxyl group is produced at the time of addition. Therefore, in this case, the polymer is not required to contain the comonomers containing an alcoholic hydroxyl group, such as 2-hydroxyethyl acrylate, 2-hydroxyethyl methacrylate, 2-hydroxypropyl acrylate, and 2-hydroxypropyl methacrylate. The presence of the comonomer containing an alcoholic hydroxyl group in the polymer, however, is preferred because the adhesion to substrates (resin films, glass substrates and the like) can be enhanced.

Monomer

Monomers usable in the photosensitive conductor paste according to the present invention should be volatilized and decomposed upon firing and, after the firing, should not leave any carbide as a residue in the formed layer. Examples of monomers usable herein include polyfunctional and monofunctional reactive monomers. Specific examples thereof include allyl (meth)acrylate, benzyl (meth)acrylate, butoxyethyl (meth)acrylate, butoxyethylene glycol (meth)acrylate, cyclohexyl (meth)acrylate, dicyclopentanyl (meth)acrylate, 2-ethylhexyl (meth)acrylate, glycerol (meth)acrylate, glycidyl (meth)acrylate, 2-hydroxyethyl (meth)acrylate, 2-hydroxypropyl (meth)acrylate, isobornyl (meth)acrylate, isodecyl (meth)acrylate, isooctyl (meth)acrylate, lauryl (meth)acrylate, 2-methoxyethyl (meth)acrylate, methoxyethylene glycol (meth)acrylate, phenoxyethyl (meth)acrylate, stearyl (meth)acrylate, ethylene glycol di(meth)acrylate, diethylene glycol di(meth)acrylate, 1,4-butanediol di(meth)acrylate, 1,5-pentanediol di(meth)acrylate, 1,6-hexanediol di(meth)acrylate, 1,3-propanediol (meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylolpropane tri(meth)acrylate, ethylene oxide-modified trimethylolpropane tri(meth)acrylate, pentaerythritol tri(meth)acrylate, pentaerythritol tetra(meth)acrylate, triethylene glycol di(meth)acrylate, propylene oxide-modified trimethylolpropane tri(meth)acrylate, butylene glycol di(meth)acrylate, 1,2,4-butanetriol tri(meth)acrylate, 2,2,4-trimethyl-1,3-pentanediol di(meth)acrylate, diallyl fumarate, 1,10-decanediol dimethyl (meth)acrylate, pentaerythritol hexa(meth)acrylate, γ-methacryloxypropyltrimethoxysilane, and 1-vinyl-2-pyrrolidone. According to the present invention, these monomers may be used alone or as a mixture of two or more. In this case, preferably, a tri- or tetra-functional monomer is used as a main component (occupying not less than 50% by weight of the whole monomer component). Use of monomers having a hydroxyl group can markedly improve the developability and photocurability of the photosensitive conductor paste.

Photopolymerization initiator

Photopolymerization initiators usable in the photosensitive conductor paste according to the present invention should be volatilized and decomposed upon firing and, after the firing, should not leave any carbide as a residue in the formed layer. Specific examples thereof include benzophenone, methyl o-benzoylbenzoate, 4,4-bis(dimethylamine)benzophenone, 4,4-bis(diethylamine)benzophenone, α-aminoacetophenone, 4,4-dichlorobenzophenone, 4-benzoyl-4-methyl diphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyl dimethyl ketal, benzyl methoxyethyl acetal, benzoin methyl ether, benzoin butyl ether, anthraquinone, 2-tert-butylanthraquinone, 2-amylanthraquinone, β-chloroanthraquinone, anthrone, benzanthrone, dibenzosuberone, methyleneanthrone, 4-azidobenzylacetophenone, 2,6-bis(p-azidobenzylidene)cyclohexane, 2,6-bis(p-azidobenzylidene)-4-methylcyclohexanone, 2-phenyl-1,2-butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propane, 2-benzyl-2-dimethylamino-1-(4-morpholinophenyl)-butanone-1, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, carbon tetrabromide, tribromophenylsulfone, benzoin peroxide, and a combination of a photoreducible dye, such as eosine or Methylene Blue, with a reducing agent, such as ascorbic acid or triethanolamine. These photopolymerization initiators may be used alone or as a mixture of two or more.

According to the present invention, among the above photopolymerization initiators, morpholine photopolymerization initiators are particularly preferred. Use of morpholine photopolymerization initiators can improve the photosensitivity of the photosensitive conductor paste and hence can increase the depth of curing. Further, in this case, side etching is less likely to occur at the time of development. Thioxanthone and amine photopolymerization initiators may be added to the morpholine photopolymerization initiator. Further, the above photopolymerization initiators may be used in combination with other photopolymerization initiators.

According to the present invention, the polymer and the monomer are preferably used in a proportion of 40 to 70% by weight polymer and 60 to 30% by weight monomer, and the amount of the photopolymerization initiator used is 1 to 20% by weight based on the total amount of the polymer and the monomer.

Conductive powder

Conductive powders usable in the photosensitive conductor paste according to the present invention include gold, silver, copper, nickel, aluminum, and silver-palladium powders. These conductive powders may be used alone or as a mixture of two or more. The conductive powder may take various particle shapes, such as spherical, flaky, massive, conical, and rod shapes. However, spherical conductive powder particles are preferred because they do not agglomerate and have good dispersibility. The average particle diameter is generally 0.05 to 10 μm, preferably 0.1 to 5 μm.

Glass frit

Glass frits usable in the photosensitive conductor pastes according to the present invention include, for example, those having a softening temperature of 450 to 600° C. and a coefficient of thermal expansion $\alpha_{300}$ of $60\times10^{-7}$ to $100\times10^{-7}/°$ C. Use of bismuth glass frits free from PbO, ZnO, and alkali oxides is preferred from the viewpoint of the resistance to the polymer and the like. When the softening temperature of the glass frit is above 600° C., the firing temperature should be increased. In this case, for example, when the heat resistance of the substrate is low, thermal deformation is unfavorably created during firing. On the other hand, when the softening temperature of the glass frit is below 450° C., the glass frit is fused before the organic components are completely removed by decomposition and volatilization upon sintering. This is unfavorably likely to create voids. When the coefficient of thermal expansion $\alpha_{300}$ of the glass frit is less than $60\times10^{-7}/°$ C. or exceeds $100\times10^{-7}/°$ C., the difference in coefficient of thermal expansion between the glass frit and the substrate is often so large that warpage and other unfavorable phenomena are likely to occur. The average particle diameter of the glass frit is generally 0.1 to 5 μm, preferably 0.1 to 2 μm. When the average particle diameter exceeds 5 μm, halation occurs upon exposure. This unfavorably results in the formation of an unsatisfactory electrode pattern in its edge shape.

Solvent

Solvents usable in the photosensitive conductor paste according to the present invention include: alcohols, such as methanol, ethanol, n-propanol, isopropanol, ethylene glycol, and propylene glycol; terpenes, such as α- or β-terpineol; ketones, such as acetone, methyl ethyl ketone, cyclohexanone, N-methyl-2-pyrrolidone, diethyl ketone, 2-heptanone, and 4-heptanone; aromatic hydrocarbons, such as toluene, xylene, and tetramethylbenzene; glycol ethers, such as cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether, and triethylene glycol monoethyl ether; acetic esters, such as ethyl acetate, butyl acetate, cellosolve acetate, ethyl cellosolve acetate, butyl cellosolve acetate, carbitol acetate, ethyl carbitol acetate, butyl carbitol acetate, propylene glycol monomethyl ether acetate, propylene glycol monoethyl ether acetate, 2-methoxyethyl acetate, cyclohexyl acetate, 2-ethoxyethyl acetate, and 3-methoxybutyl acetate; diethylene glycol dialkyl ether; dipropylene glycol dialkyl ether; ethyl 3-ethoxypropionate; methyl benzoate; N,N-dimethylacetamide; and N,N-dimethylformamide. These solvents may be used alone or as a mixture of two or more.

Other components (1) Organic components

The photosensitive conductor paste of the present invention may contain thermoplastic resins as an organic component that can be removed upon firing. The thermoplastic resin can function as a binder for the inorganic components or can improve the transferability of the photosensitive conductor paste. Examples of thermoplastic resins usable herein include: homopolymers or copolymers prepared from at least one member selected from methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, 2-hydroxyethyl acrylate, 2-hydroxyethyl methacrylate, 2-hydroxypropyl acrylate, 2-hydroxypropyl methacrylate, styrene, α-methylstyrene, and N-vinyl-2-pyrrolidone; and cellulose derivatives, such as ethylcellulose.

Among them, homopolymers or copolymers prepared from at least one member selected from methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, 2-hydroxyethyl acrylate, 2-hydroxyethyl methacrylate, 2-hydroxypropyl acrylate, and 2-hydroxypropyl methacrylate, and ethyl cellulose are particularly preferred.

Further, the photosensitive conductor paste of the present invention may if necessary contain other additives, such as sensitizers, terminators, chain transfer agents, levelling agents, dispersants, transfer agents, stabilizers, antifoaming agents, thickeners, suspending agents, and release agents.

The transfer agent is added in order to improve the transferability of the photosensitive conductor paste, when used in the form of a transfer sheet, and the fluidity of the paste. Examples of transfer agents usable herein include: n-alkyl phthalates, such as dimethyl phthalate, dibutyl phthalate, and di-n-octyl phthalate; phthalic esters, such as di-2-ethylhexyl phthalate, diisodecyl phthalate, butylbenzyl phthalate, diisononyl phthalate, ethyl phthalyl ethyl glycolate, and butyl phthalyl butyl glycolate; trimellitic esters, such as tri-2-ethylhexyl trimellitate, tri-n-alkyl trimellitate, triisononyl trimellitate, and triisodecyl trimellitate; aliphatic dibasic acid esters, such as dimethyl adipate, dibutyl adipate, di-2-ethylhexyl adipate, diisodecyl adipate, dibutyl diglycol adipate, di-2-ethylhexyl azelate, dimethyl sebacate, dibutyl sebacate, di-2-ethylhexyl sebacate, di-2-ethylhexyl maleate, acetyl-tri-(2-ethylhexyl)citrate, acetyl-tri-n-butyl citrate, and acetyltributyl citrate; glycol derivatives, such as polyethylene glycol benzoate, triethylene glycol-di-(2-ethylhexoate), and polyglycol ether; glycerin derivatives, such as glycerol triacetate and glycerol diacetyl monolaurate; polyesters of sebacic acid, adipic acid, azelaic acid, phthalic acid or the like; low-molecular weight polyethers having a molecular weight of 300 to 3000; low-molecular weight poly-α-styrene having a molecular weight of 300 to 3000; low-molecular weight polystyrene having a molecular weight of 300 to 3000; phosphoric esters, such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyldiphenyl phosphate, xylenyldiphenyl phosphate, and 2-ethylhexyldiphenyl phosphate; ricinolic esters, such as methylacetyl ricinolate; polyesters and epoxidized esters, such as poly-1,3-butanediol adipate and polyester epoxidized soybean oil; and acetic esters, such as glycerin triacetate and 2-ethylhexyl acetate.

The dispersant and the suspending agent function respectively to improve the dispersibility of the inorganic powder and to improve the suspendability of the inorganic powder. Examples thereof include amide, phosphoric ester, silicone, castor oil, castor oil ester, and other various surfactants. Antifoaming agents usable herein include, for example, silicone, acrylic, and other various surfactants. Release agents usable herein include, for example, silicone, fluorooil, paraffin, fatty acid, fatty ester, castor oil, wax, and compound type release agents. Levelling agents usable herein include, for example, fluoro, silicone, and other various surfactants. These additives may be added in a suitable amount.

(2) Inorganic component

The photosensitive conductor paste of the present invention may contain as the inorganic component, besides the conductor powder and the glass frit, other inorganic powders, such as powders of aluminum oxide, boron oxide, silica, titanium oxide, zirconium oxide, magnesium oxide, calcium oxide, strontium oxide, barium oxide, and calcium carbonate. The inorganic powder may be incorporated in an amount of not more than 10 parts by weight based on 100 parts by weight of the conductive powder. The average particle diameter of the inorganic powder is preferably 0.005 to 10 µm. The inorganic powder functions to impart thixotropy to the photosensitive conductor paste. This prevents sedimentation of the conductive powder and the glass frit. Further, the inorganic powder functions as an aggregate to prevent the flow of the pattern during firing. Further, fire-resistant black pigments may be incorporated as the inorganic powder to improve the contrast. Examples of black pigments usable herein include Co—Cr—Fe, Co—Mn—Fe, Co—Fe—Mn—Al, Co—Ni—Cr—Fe, Co—Ni—Mn—Cr—Fe, Co—Ni—Al—Cr—Fe, and Co—Mn—Al—Cr—Fe—Si. The fire-resistant black pigment may be incorporated in an amount of 3 to 20 parts by weight based on 100 parts by weight of the conductive powder.

Electrodes may be prepared using the photosensitive conductor paste of the present invention as follows. Specifically, a photosensitive conductor layer is formed on a substrate by coating the photosensitive conductor paste directly on the substrate, or by transferring the photosensitive conductor paste from a transfer sheet described below. The photosensitive conductor layer is exposed through a predetermined photomask followed by development. The developed photosensitive conductor layer is then fired to remove the organic components. Thus, electrodes are formed.

The photosensitive conductor paste of the present invention may be coated on the substrate by conventional coating means, such as screen printing, direct gravure coating, gravure reverse coating, reverse roll coating, slide die coating, slit die coating, or Komma coating. The thickness of the photosensitive conductor layer directly formed on the substrate may be, for example, 5 to 30 µm, preferably 7 to 20 µm.

An embodiment of the transfer sheet using the photosensitive conductor paste of the present invention is shown in FIG. 1. The transfer sheet 1 shown in FIG. 1 comprises a base film 2, a transfer layer 3 releasably provided on the base film 2, and a protective film 4 releasably provided on the transfer layer 3.

The transfer layer 3 may be formed by coating the base film 2 with the photosensitive conductor paste of the present invention according to conventional coating means, such as direct gravure coating, gravure reverse coating, reverse roll coating, slit reverse coating, slide die coating, slit die coating, or Komma coating. The thickness of the transfer layer 3 may be, for example, 5 to 30 µm, preferably 7 to 20 µm.

The base film 2 constituting the transfer sheet 1 is made of a material that, in forming the transfer layer 3, is resistant to the photosensitive conductor paste of the present invention, is flexible, and causes no significant deformation under tension or pressure. An example of the material usable for the transfer layer is a resin film. Specific examples of resin films usable herein include: films of polyethylene, ethylene/vinyl acetate copolymer, ethylene/vinyl alcohol copolymer, polypropylene, polystyrene, polymethacrylic acid, polyvinyl chloride, polyvinyl alcohol, polyvinyl butyral, nylon, polyether ether ketone, polyphenylene sulfide, polysulfone, polyether sulfone, polytetrafluoroethylene/perfluoroalkyl vinyl ether, polyvinyl fluoride, tetrafluoroethylene/ethylene, tetrafluoroethylene/hexafluoropropylene, polychlorotrifluoroethylene, polyvinylidene fluoride, polyethylene terephthalate film, 1,4-polycyclohexylene dimethylene terephthalate, polyethylene naphthalate, polyester, cellulose triacetate, polycarbonate, polyurethane, polyimide, and polyetherimide; films of the above resin materials with a filler incorporated therein; monoaxially or biaxially stretched films of the above resin materials; biaxially stretched films of the above resin materials wherein the stretch ratio in the widthwise direction has been made higher than that in the direction of flow; biaxially stretched films of the above resin materials wherein the stretch ratio in the direction of flow has been made higher than that in the widthwise direction; laminates of two or more films of the same or different type described above; and composite films prepared by coextruding resins of the same or different type selected from the resins for the above films. Further, treated products of the above resin films may also be used. Examples thereof include silicone-treated polyethylene terephthalate, corona-treated polyethylene terephthalate, silicone-treated polypropylene, and corona-treated polypropylene. Further, metal foils and metal sheet in coil may also be used as the base film 2. Specific examples of metal foils and metal sheets in coil include copper foils, copper sheets in coil, aluminum foils, aluminum sheets in coil, SUS 430, SUS 301, SUS 304, SUS 420 J2, SUS 631 and other stainless steel sheets in coil, and beryllium sheets in coil. Laminates of the metal foils or metal sheets in coil onto the resin films may also be used. The thickness of the base film 2 is generally 4 to 400 µm, preferably 10 to 100 µm.

The protective film 4 constituting the transfer sheet 1 may be made of a material that is flexible and causes no significant deformation under tension or pressure. Specific examples of protective films usable herein include: films of polyethylene, ethylene/vinyl acetate copolymer, ethylene/vinyl alcohol copolymer, polypropylene, polystyrene, polymethacrylic acid, polyvinyl chloride, polyvinyl alcohol, polyvinyl butyral, nylon, polyether ether ketone, polysulfone, polyether sulfone, polytetrafluoroethylene/perfluoroalkyl vinyl ether, polyvinyl fluoride, tetrafluoroethylene/ethylene, tetra fluoroethylene/hexafluoropropylene, polychlorotrifluoroethylene, polyvinylidene fluoride, polyethylene terephthalate film, polyethylene naphthalate, polyester, cellulose triacetate, polycarbonate, polyurethane, polyimide, and polyetherimide; films of the above resin materials with a filler incorporated therein; monoaxially or biaxially stretched films of the above resin materials; biaxially stretched films of the above resin materials wherein the stretch ratio in the widthwise direction has been made higher than that in the direction of flow; biaxially stretched films of the above resin materials wherein the stretch ratio in the direction of flow has been made higher than that in the widthwise direction; laminates of two or more films of the same or different type described above; and composite films prepared by coextruding resins of the same or different type selected from the resins for the above films. Among the above films, biaxially stretched polyester films are particularly preferred. Treated products of the above resin films may also be used. Examples thereof include silicone-treated polyethylene terephthalate, corona-treated polyethylene terephthalate, melamine-treated polyethylene terephthalate, silicone-treated polypropylene, corona-treated polypropylene, silicone-treated polyethylene, and corona-treated polyethylene. The thickness of the protective film 4 is generally 4 to 400 µm, preferably 6 to 100 µm.

The transfer sheet 1 may be in any of a sheet form and a continuous form. In the case of the continuous form, the transfer sheet may be wound around a core to form a roll. For the core, preferred are cores prepared by molding ABS resin, vinyl chloride resin, Bakelite or the like, and resin-impregnated paper tubes.

The following examples further illustrate the present invention but are not intended to limit it.

EXAMPLE 1

Sample 1

Sample 1 having the following composition was prepared as a photosensitive conductor paste. The total content (% by weight) of the polymer, the monomer, and the photopolymerization initiator, the content (% by weight) of the conductive powder, and the content (% by weight) of the glass frit, each based on the solid content of the photosensitive conductor paste, are summarized in Table 1 below.

| Composition of photosensitive conductor paste | |
|---|---|
| Polymer<br>Adduct of copolymer of n-butyl methacrylate (60% by mole)/2-hydroxypropyl methacrylate (10% by mole)/methacrylic acid (30% by mole) with 10% by mole of glycidyl methacrylate (molecular weight = 60,000, Tg = 50° C., acid value = 90) | 14 pts. wt. |
| Monomer<br>Pentaerythritol tri/tetraacrylate | 12 pts. wt. |
| Photopolymerization initiator (based on morpholine)<br>Irgacure 369 manufactured by Ciba Specialty, Chemicals, K.K.) | 1 pt. wt. |
| Conductive powder<br>Silver powder (spherical, average particle diameter 1 µm) | 95 pts. wt. |
| Glass frit<br>(main components: $Bi_2O_3$, $SiO_2$, and $B_2O_3$ (alkali-free), softening point 500° C., average particle diameter 1 µm) | 5 pts. wt. |
| Solvent<br>3-Methoxybutyl acetate | 23 pts. wt. |

Samples 2 to 5

Photosensitive conductor pastes (samples 2 to 5) were prepared in the same manner as described above in connection with sample 1, except that the total content (% by weight) of the polymer, the monomer, and the photopolymerization initiator, the content (% by weight) of the conductive powder, and the content (% by weight) of the glass frit, each based on the solid content of the photosensitive conductor paste, were varied as shown in Table 1 below.

Sample 6

A photosensitive conductor paste (sample 6) was prepared in the same manner as described above in connection with sample 1, except that the following polymer was used instead of the polymer in sample 1.

Polymer

Copolymer of n-butyl methacrylate (60% by mole)/2-hydroxyethyl methacrylate (15% by mole)/methacrylic acid (25% by mole) (molecular weight=80,000, Tg=42° C., acid value=115)

Comparative Samples 1 to 6

Photosensitive conductor pastes (comparative samples 1 to 6) were prepared in the same manner as described above in connection with sample 1, except that the total content (% by weight) of the polymer, the monomer, and the photopolymerization initiator, the content (% by weight) of the conductive powder, and the content (% by weight) of the glass frit, each based on the solid content of the photosensitive conductor paste, were varied as shown in Table 1 below.

Comparative Sample 7

A photosensitive conductor paste (comparative sample 7) was prepared in the same manner as described above in connection with sample 1, except that the following polymer free from the alcoholic hydroxyl group was used instead of the polymer in sample 1.

Polymer

Copolymer of n-butyl methacrylate (65% by mole)/ethyl methacrylate (10% by mole)/methacrylic acid (25% by mole) (molecular weight=60,000, Tg=38° C.)

Comparative Sample 8

A photosensitive conductor paste (comparative sample 8) was prepared in the same manner as described above in connection with sample 1, except that the following polymer having a high glass transition temperature Tg was used instead of the polymer in sample 1.

Polymer

Adduct of copolymer of methacrylate (70% by mole)/methacrylic acid (30% by mole) with 10% by mole of diglycidyl methacrylate (molecular weight=60,000, Tg=120° C.)

Comparative Sample 9

A photosensitive conductor paste (comparative sample 9) was prepared in the same manner as described above in connection with sample 1, except that the glass frit used had an average particle diameter of 8 μm.

Comparative Sample 10

A photosensitive conductor paste (comparative sample 10) was prepared in the same manner as described above in connection with sample 1, except that a benzophenone photopolymerization initiator Irgacure 651 (manufactured by Ciba Specialty, Chemicals, K.K.) was used as the photopolymerization initiator instead of Irgacure 369.

Comparative Sample 11

A photosensitive conductor paste (comparative sample 11) was prepared in the same manner as described above in connection with sample 1, except that the molecular weight of the polymer used was 200,000 instead of 60,000.

Comparative Sample 12

A photosensitive conductor paste (comparative sample 12) was prepared in the same manner as described above in connection with sample 1, except that the following polymer was used instead of the polymer in sample 1.

Polymer

Copolymer of 2-ethylhexyl acrylate (60% by mole)/2-hydroxy methacrylate (15% by mole)/acrylic acid (25% by mole) (molecular weight=60,000, Tg=5° C., acid value=108)

The photosensitive conductor pastes thus prepared (samples 1 to 6 and comparative samples 1 to 12) were evaluated for the dispersibility, the developability, the edge shape, and the adhesion by the following methods. The results are shown in Table 1 below.

Dispersibility

The photosensitive conductor paste was blade-coated on a polyethylene terephthalate film (Lumirror T-60, manufactured by Toray Industries, Inc.). The coating was dried at 100° C. for 2 min to form a 15 μm-thick transfer layer. The surface glossiness of the transfer layer was measured with a gloss meter (VGS-100/DP, manufactured by Nippon Denshoku Co., Ltd.) at 75° C. to evaluate the dispersiblity in terms of the surface glossiness of the transfer layer according to the following criteria.

O (good dispersiblity): surface glossiness exceeding 70

Δ (somewhat poor dispersibility): surface glossiness of 50 to 70

X (poor dispersibility): surface glossiness of less than 50

Developability

The transfer sheet, which had been formed for the evaluation of the dispersibility, was applied by means of a hot pressure roll of 80° C. using an automatic cutting laminator onto a glass substrate heated at 60° C. to form a photosensitive conductive layer by transfer. The photosensitive conductor layer was exposed to ultraviolet light (light source: ultrahigh-pressure mercury lamp) through a negative pattern mask (spacing between lines: 90 μm) of an electrode at 700 mJ/cm$^2$, followed by development with a 0.5% aqueous sodium carbonate solution. The margin was calculated by the following equation.

Margin=(time taken for exposed areas to flow out)/(time taken for unexposed areas to be developed)

The results were evaluated according to the following criteria.

O (good developability): margin exceeding 1.4 times

Δ (somewhat poor developability): margin of 1.0 to 1.4 times

X (poor developability): margin of less than 1.0 time

Edge shape

The pattern after the development prepared in the evaluation of the developability was visually inspected for edge shape. The results were evaluated according to the following criteria.

O (good edge shape): no protrusion present

Δ (somewhat poor edge shape): protrusions of about 10 μm present

X (poor edge shape): protrusions of about 20 μm present

Adhesion

The photosensitive conductor paste was blade-coated on a polyethylene terephthalate film (Lumirror T-60, manufactured by Toray Industries, Inc.). The coating was dried at 100° C. for 2 min to form a 15 μm-thick transfer layer. A silicone-treated polyethylene terephthalate film (03-25-C, manufactured by Tohcello Co., Ltd.) was laminated onto the transfer layer. One week after that, the silicone-treated polyethylene tetephthalate film was separated from the transfer layer. The results were evaluated according to the following criteria.

O (good adhesion): the polyethylene terephthalate film and the transfer layer not lifted at the time of separation of the silicone-treated polyethylene terephthalate film Δ (somewhat poor adhesion): a part of the polyethylene terephthalate film and the transfer layer lifted at the time of separation of the silicone-treated polyethylene terephthalate film X (poor adhesion): the transfer layer separated and transferred onto the silicone-treated polyethylene terephthalate film at the time of separation of the silicone-treated polyethylene terephthalate film

TABLE 1

| Photosensitive conductor paste | Content based on solid content of paste, wt % | | | Hydroxy group in polymer | Dispersibility | Developability | Edge shape | Adhesion |
|---|---|---|---|---|---|---|---|---|
| | Organic component* | Conductive powder | Glass frit | | | | | |
| Sample 1 | 21 | 75 | 4 | Present | ○ | ○ | ○ | ○ |
| Sample 2 | 28 | 68 | 4 | Present | ○ | ○ | ○ | ○ |
| Sample 3 | 13 | 83 | 4 | Present | ○ | ○ | ○ | ○ |
| Sample 4 | 30 | 60 | 10 | Present | ○ | ○ | ○ | ○ |
| Sample 5 | 9 | 90 | 1 | Present | ○ | ○ | ○ | ○ |
| Sample 6 | 21 | 75 | 4 | Present | ○ | ○ | ○ | ○ |
| Comparative Sample 1 | 35 | 60 | 5 | Present | ○ | ○ | ○ | ○ |
| Comparative Sample 2 | 5 | 92 | 3 | Present | X | X | X | Δ |
| Comparative Sample 3 | 40 | 50 | 10 | Present | ○ | ○ | ○ | ○ |
| Comparative Sample 4 | 7 | 92 | 1 | Present | ○ | X | X | Δ |
| Comparative Sample 5 | 17 | 70 | 13 | Present | ○ | ○ | Δ | ○ |
| Comparative Sample 6 | 25 | 75 | 0 | Present | ○ | ○ | ○ | ○ |
| Comparative Sample 7 | 21 | 75 | 4 | Absent | Δ | Δ | Δ | X |
| Comparative Sample 8 | 21 | 75 | 4 | Absent | Δ | X | ○ | Δ |
| Comparative Sample 9 | 21 | 75 | 4 | Present | ○ | ○ | X | ○ |
| Comparative Sample 10 | 21 | 75 | 4 | Present | ○ | Impossible to form pattern | ○ | ○ |
| Comparative Sample 11 | 21 | 75 | 4 | Present | ○ | Impossible to form pattern | — | Δ |
| Comparative Sample 12 | 21 | 75 | 4 | Present | ○ | Impossible to form pattern | — | X |

*Organic component = polymer + monomer + photopolymerization initiator

As is apparent from Table 1, the photosensitive conductor pastes of samples 1 to 6 had excellent dispersibility and developability, and patterns obtained by exposure, through a predetermined photomask, and development of photosensitive conductor layers formed using these photosensitive conductor pastes had sharp edge shape and excellent adhesion, indicating that electrode patterns could be formed with high accuracy.

By contrast, the photosensitive conductor pastes of comparative samples 2, 4, 5, and 7 were poor in at least one of dispersibility, developability, edge shape, and adhesion. This made it difficult to form electrode patterns with high accuracy from these photosensitive conductor pastes. The photosensitive conductor paste of comparative sample 5 further had poor storage stability.

The photosensitive conductor pastes of comparative samples 1, 3, and 6 had good dispersibility, developability, edge shape, and adhesion. Since, however, the content of the organic component is high, breaking of electrode patterns frequently occurred. For this reason, these electrode patterns were unusable for practical use. For the photosensitive conductor paste of comparative sample 6 not containing any glass frit, electrode patterns after firing had unsatisfactory strength.

The photosensitive conductor pastes of comparative samples 8 to 10 somewhat suffered from a problem associated with at least one of dispersibility, developability, edge shape, and adhesion. This resulted in unsatisfactory electrode pattern accuracy.

For the photosensitive conductor paste of comparative sample 11, the transferability and the developability were so poor that it was difficult to form electrode patterns with high accuracy.

Further, for the photosensitive conductor paste of comparative sample 12, the adhesion and the transferability were so poor that it was difficult to form electrode patterns with high accuracy.

What is claimed is:

1. A plasma display panel having an electrode pattern formed from a photosensitive conductor paste comprising at least a polymer having an alcoholic hydroxyl group and a carboxyl group, a monomer, a photopolymerization initiator, a conductive powder, a glass frit, and a solvent, the total content of the polymer, the monomer, and photopolymerization initiator being 9 to 30% by weight on a solid basis of the photosensitive conductor paste, the conductive powder being present in an amount of 60 to 90% by weight on a solid basis of the photosensitive conductor paste, and the glass frit being present in an amount of 1 to 10% by weight on a solid basis of the photosensitive conductor paste.

2. The plasma display panel according to claim 1, wherein the polymer has a molecular weight of 10,000 to 150,000.

3. The plasma display panel according to claim 1, wherein the photopolymerization initiator is a morpholine photopolymerization initiator.

4. The plasma display panel according to claim 2, wherein the photopolymerization initiator is a morpholine photopolymerization initiator.

5. The plasma display panel according to claim 1, wherein the polymer has a glass transition temperature in the range of 20° C.

* * * * *